United States Patent
Jolley

[11] Patent Number: 5,980,643
[45] Date of Patent: Nov. 9, 1999

[54] ALKALINE WATER-BASED SOLUTION FOR CLEANING METALLIZED MICROELECTRONIC

[75] Inventor: Michael K. Jolley, Kalispell, Mont.

[73] Assignee: Semitool, Inc., Kalispell, Mont.

[21] Appl. No.: 09/099,309

[22] Filed: Jun. 18, 1998

[51] Int. Cl.$^6$ .............................. C03C 23/00; C23G 1/02
[52] U.S. Cl. ................................. 134/2; 134/3; 134/41
[58] Field of Search ............................. 134/2, 3, 40, 41

[56] References Cited

U.S. PATENT DOCUMENTS

| | | | |
|---|---|---|---|
| 4,140,647 | 2/1979 | Mizutani et al. | 510/150 |
| 4,270,957 | 6/1981 | Donakowski et al. | 132/2 |
| 4,382,825 | 5/1983 | McCready | 134/2 |
| 4,457,322 | 7/1984 | Rubin et al. | 134/2 |
| 4,599,116 | 7/1986 | King et al. | 134/2 |
| 4,762,638 | 8/1988 | Dollman et al. | 252/135 |
| 4,964,919 | 10/1990 | Payne | 134/2 |
| 5,230,833 | 7/1993 | Romberger et al. | 252/363.5 |
| 5,382,295 | 1/1995 | Aoki et al. | 134/2 |
| 5,441,572 | 8/1995 | Rodzewich | 134/2 |
| 5,466,389 | 11/1995 | Ilardi et al. | 134/2 |
| 5,472,512 | 12/1995 | Gober et al. | 134/2 |

*Primary Examiner*—Jill Warden
*Assistant Examiner*—Yolanda E. Wilkins
*Attorney, Agent, or Firm*—Rockey, Milnamow & Katz, Ltd.

[57] ABSTRACT

A method for use in the manufacture of a microelectronic device is set forth. The method include to a first step in which a workpiece including exposed aluminum metallized surfaces and residues is provided. The workpiece, including the exposed aluminum metallized surfaces, is then treated with an alkaline, water-based solution containing one or more components that form an aluminosilicate on the exposed aluminum metallized surfaces. The solution reacts with the residues and assists in removing them from the workpiece. Preferably, the solution is comprised of DI water, and ammonium hydroxide based component, such as TMAH, silicic acid, and aluminum hydroxide.

12 Claims, 1 Drawing Sheet

ALKALINE WATER-BASED SOLUTION FOR CLEANING METALLIZED MICROELECTRONIC

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The importance of clean semiconductor workpiece surfaces in the fabrication of semiconductor microelectronic devices has been recognized for a considerable period of time. Over time, as VLSI and ULSI silicon circuit technology has developed, the cleaning processes have gradually become a particularly critical step in the fabrication process. It has been estimated that over 50% of the yield losses sustained in the fabrication process are a direct result of workpiece contaminants. Trace impurities, such as sodium ions, metals, and particles, are especially detrimental if present on semiconductor surfaces during high-temperature processing because they may spread and diffuse into the semiconductor workpiece and thereby alter the electrical characteristics of the devices formed in the workpiece. Similar requirements are placed on other such items in the electronics industry, such as in the manufacture of flat panel displays, hard disk media, CD glass, and other such workpieces.

Cleaning of a semiconductor workpiece, and other electronic workpieces, occurs at many intermediate stages of the fabrication process. Cleaning of the workpiece is often critical after, for example, photoresist stripping and/or ashing. This is particularly true where the stripping and/or ashing process immediately proceeds a thermal process. Complete removal of the ashed photoresist or the photoresist/stripper is necessary to insure the integrity of subsequent processes.

The actual stripping of photoresist from the workpiece is yet another fabrication process that is important to integrated circuit yield, and the yield of other workpiece types. It is during the stripping process that a substantial majority of the photoresist is removed or otherwise disengaged from the surface of the semiconductor workpiece. If the stripping agent is not completely effective, photoresist may remain bonded to the surface. Such bonded photoresist may be extremely difficult to remove during a subsequent cleaning operation and thereby impact the ability to further process the workpiece.

Various techniques are used for stripping photoresist from the semiconductor workpiece. Mixtures of sulfuric acid and hydrogen peroxide at elevated temperatures are commonly used. However, such mixtures are unsuitable for stripping photoresist from wafers on which metals, such as aluminum or copper, have been deposited. This is due to the fact that such solutions will attack the metals as well as the photoresist. Solvent chemistries are often used after metal layers have been deposited. In either case, limited bath life, expensive chemistries, and high waste disposal costs have made alternative strip chemistries attractive.

Plasma stripping systems provide such an alternative and have been used for stripping both pre- and post-metal photoresist layers. This stripping technique, however, does not provide an ideal solution due to the high molecular temperatures generated at the semiconductor workpiece surface. Additionally, since photoresist is not purely a hydrocarbon (i.e., it generally contains elements other than hydrogen and carbon), residual compounds may be left behind after the plasma strip. Such residual compounds must then the removed in a subsequent wet clean.

As such, one of the more vexing problems in microelectronic device fabrication, such as in the manufacture of semiconductor integrated circuits, is the cleaning of workpieces having exposed metallization at their surfaces. Frequently, such cleaning involves removal of residues formed during the etching and plasma ashing processes associated with forming patterned metallization on the workpiece surface. These residues are commonly called "polymers", but also include inorganic compounds.

To date the most successful methods for removing these residues has involved non-water based wet cleans. These cleans have mainly involved hydroxylamine based reducing chemistries and have been found to be quite effective and robust. The typical polymer removal process also uses IPA as an intermediate rinse agent to eliminate corrosion that could happen in the final DI rinse if the amines in the residue remover mixed directly with water. However, the semiconductor industry is being driven to eliminate or reduce the use of such chemistries because of environmental regulations and cost concerns.

The present inventor has recognized that a water-based replacement for these mixtures would have many advantages over the non-water based chemistries currently employed. This is due to the fact that high pH water based solutions have the ability to dissolve many of the inorganic compounds thought to exist in, for example, post etch residues. Examples of such solutions include solutions of ammonium hydroxide or tetramethylammonium hydroxide. While these solutions etch Ti and TiN films on the order of Angstroms per minute and are thus suitable for use with such films, they etch aluminum films on the order of microns per minute and are thus not suitable for use with workpieces having exposed aluminum metallization. As such, the use of such solutions in residue removal has not been explored in any significant manner.

BRIEF SUMMARY OF THE INVENTION

A method for use in the manufacture of a microelectronic device is set forth. The method include to a first step in which a workpiece including exposed aluminum metallized surfaces and residues is provided. The workpiece, including the exposed aluminum metallized surfaces, is then treated with an alkaline, water-based solution containing one or more components that form an aluminosilicate on the exposed aluminum metallized surfaces. The solution reacts with the residues and assists in removing them from the workpiece. Preferably, the solution is comprised of DI water, and ammonium hydroxide based component, such as TMAH, silicic acid, and aluminum hydroxide.

DETAILED DESCRIPTION OF THE INVENTION

Figure 1:
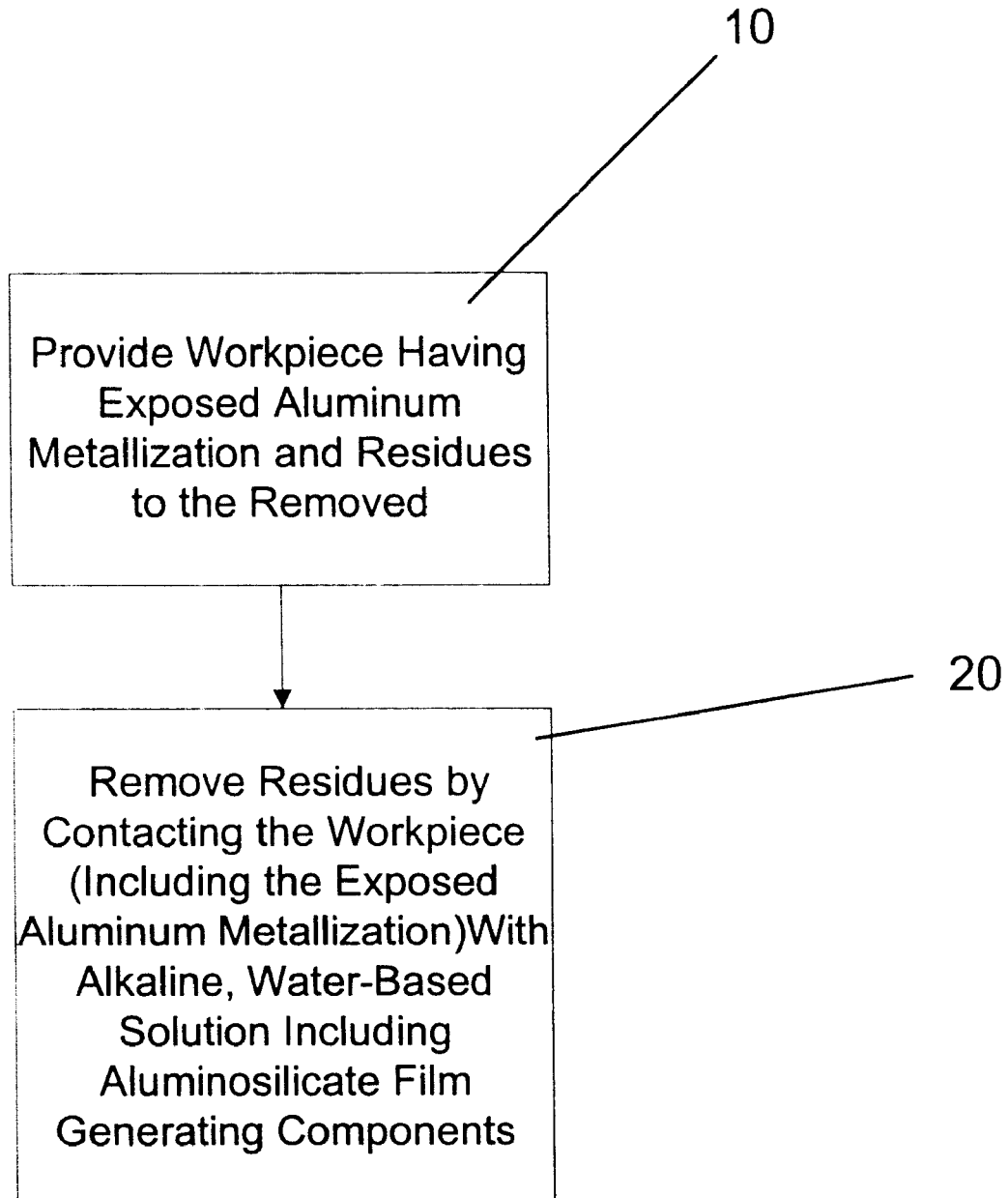
FIG. 1 is a process flow diagram illustrating one embodiment of a process in accordance with the present invention.

FIG. 1 is a process flow diagram illustrating one embodiment of a process for treating a workpiece, such as a semiconductor wafer, pursuant to manufacturing a microelectronic component, such as a semiconductor integrated circuit. As illustrated, the workpiece is provided for processing at step 10. The workpiece is preferably in the form of a semiconductor wafer having aluminum interconnect metallization that is exposed at a surface of the workpiece. The surface also includes residues that remain after prior processing. Such prior processing may include plasma etching, plasma ashing, and/or photoresist stripping processes that generally leave polymer in inorganic compounds as residues.

At step 20 of FIG. 1, the workpiece is brought into contact with an alkaline, water-based solution that is formulated to remove the residues without substantially attacking the aluminum metallization. More particularly, the alkaline, water-based solution includes one or more components that form an aluminosilicate film over the exposed surfaces of the aluminum metallization, which passivates the metallization and inhibits corrosion that would otherwise occur due to the alkaline nature of the solution. The workpiece and solution may be brought into contact with one another using, for example, a Spray Acid Tool available from Semitool, Inc., of Kalispell, Mont.

In accordance with a preferred solution composition, the solution includes DI water and an ammonium hydroxide based component, such as tetramethylammonium hydroxide (TMAH). The ammonium hydroxide based component is used to render the solution alkaline. The solution further comprises small amount of silicic acid and aluminum hydroxide. The solution forms a passive aluminosilicate film that grows on the surfaces of the aluminum metallization. In this embodiment of the solution, the silicic acid is the source of the silicon and the aluminum hydroxide is the source of aluminum ions.

Experiments have been performed using various relative concentrations of the foregoing components. To this end, a 10 liter solution was formed by adding DI water to 35 cc of 25% weight TMAH, 48 grams of silicic acid, and 1.4 grams of aluminum hydroxide. Semiconductor wafers having exposed aluminum pads that were surrounded by residues, including oxides, were used. A scanning profilometer was used to measure the step height between the residues and the aluminum pads as well as the surface roughness of the pads. The solution was heated to 80 degrees Celsius and the wafers were then exposed to the solution for approximately 10 minutes. While the solution removed the residues, no significant pitting or corrosion of the aluminum pads was observed. Similar tests were also performed with mixtures of 950 cc of DI water, 50 cc of ammonium hydroxide, 4.8 grams of silicic acid, and 0.14 grams of aluminum hydroxide, with substantially the same results. Still further, solutions using $NH_4OH$ instead of TMAH have also approved effective. In all instances, no noticeable reduction in the sheet resistance of the aluminum metallization has been observed as a result of this treatment.

Lower concentrations of silicic acid are not as effective in passivating the exposed aluminum metallization. Preferably, the solution is substantially saturated with silicic acid for more effective passivation.

In some instances, it may be desirable to include surfactants in the solution. Such surfactants may assist in inhibiting particle re-deposition and, further, may in a bit roughenning of any exposed silicon surfaces. For example, and amount of FC 93 and NCW 601 may be added to the solution for this purpose.

The foregoing method can also be generalized for use with other metals used for metallization, such as copper. To this end, a workpiece including exposed metallized surfaces of a metal X and further including surface residues is provided. The workpiece, including the exposed metallized surfaces, is treated with an alkaline, water-based solution containing one or more components that form a protective compound of metal X on the exposed metallized surfaces that prevents the metallized surfaces from substantial corrosion resulting from contact with the solution. The alkaline nature of the solution assists in removing the residues from the workpiece.

The foregoing alkaline, water-based solutions have substantial benefits over the prior cleaning solutions. For example, water-based solutions tend to be more environmentally friendly and, as such, are generally cheaper to obtain, use, and dispose. Such solutions do not require dedicated drains or special waste disposal. Further, intermediate IPA rinsing of the workpiece may, if desired, be eliminated when such solutions are used.

Numerous modifications may be made to the foregoing process without departing from the basic teachings thereof. Although the present invention has been described in substantial detail with reference to one or more specific embodiments of the process and solution, those of skill in the art will recognize that changes may be made thereto without departing from the scope and spirit of the invention as set forth in the appended claims.

I claim:

1. A method for use in the manufacture of a microelectronic device comprising the steps of:

providing a workpiece including exposed aluminum metallized surfaces and residues;

treating the workpiece, including the exposed aluminum metallized surfaces, with an alkaline, water-based solution containing an aluminum-containing constituent and a silicon-containing constituent that react to form an aluminosilicate on the exposed aluminum metallized surfaces, the solution assisting in removal of the residues from the workpiece.

2. A method as claimed in claim 1 wherein the silicon-containing constituent comprises silicic acid.

3. A method as claimed in claim 1 wherein the solution further comprises one or more surfactants.

4. A method as claimed in claim 1 and further comprising the step of heating the alkaline, water-based solution for treatment of the workpiece.

5. A method as claimed in claim 2 wherein the aluminum-containing constituent comprises aluminum hydroxide.

6. A method as claimed in claim 5 wherein the solution further comprises ammonium hydroxide.

7. A method for use in the manufacture of a microelectronic device comprising the steps of:

providing a workpiece including exposed aluminum metallized surfaces and residues;

cleaning the workpiece to remove the residues using an alkaline, water-based solution comprising aluminum hydroxide and silicic acid.

8. A method as claimed in claim 7 wherein the solution is substantially saturated with the silicic acid.

9. A method as claimed in claim 7 wherein the solution further comprises one or more surfactants.

10. A method as claimed in claim 7 wherein the solution comprises an ammonium hydroxide.

11. A method as claimed in claim 10 wherein the ammonium hydroxide is tetramehtylammonium hydroxide.

12. A method as claimed in claim 7 and further comprising the step of heating the alkaline, water-based solution for treatment of the workpiece.

* * * * *

UNITED STATES PATENT AND TRADEMARK OFFICE
CERTIFICATE OF CORRECTION

PATENT NO. : 5,980,643
DATED : November 9, 1999
INVENTOR(S) : Michael K. Jolley

It is certified that error appears in the above-indentified patent and that said Letters Patent is hereby corrected as shown below:

On the title page, item [54] and Column 1:

In the Title, line 3, insert --WORKPIECES AND METHODS OF USING SAME-- after "MICROELECTRONIC".

In the Abstract, line 2, cancel "include to" and substitute --includes-- therefor.

Column 2, line 4, cancel "a" and substitute --be-- therefor.

Column 2, line 42, cancel "include to" and substitute --includes-- therefor.

Column 3, line 55, cancel "in a bit" and substitute --inhibit-- therefor.

Column 3, line 56, cancel "and" and substitute --an-- therefor.

Column 4, line 59, cancel "tetramehtylammonium" and substitute --tetramethylammonium-- therefor.

Signed and Sealed this

Third Day of April, 2001

*Attest:*

NICHOLAS P. GODICI

*Attesting Officer*  *Acting Director of the United States Patent and Trademark Office*